(12) United States Patent
Mallett

(10) Patent No.: US 7,477,492 B2
(45) Date of Patent: Jan. 13, 2009

(54) SUPERCONDUCTING MAGNET SYSTEM

(75) Inventor: Michael John Disney Mallett, Witney (GB)

(73) Assignee: Siemens Magnet Technology Ltd., Witney (GB)

( * ) Notice: Subject to any disclaimer, the term of this patent is extended or adjusted under 35 U.S.C. 154(b) by 376 days.

(21) Appl. No.: 11/349,206

(22) Filed: Feb. 8, 2006

(65) Prior Publication Data

US 2006/0197637 A1 Sep. 7, 2006

(30) Foreign Application Priority Data

Mar. 4, 2005 (GB) ................................. 0504488.8

(51) Int. Cl.
*H01F 6/00* (2006.01)
*H02H 7/00* (2006.01)

(52) U.S. Cl. ........................................ 361/19; 361/141
(58) Field of Classification Search ................. 335/216; 361/19, 141; 324/318–320
See application file for complete search history.

(56) References Cited

U.S. PATENT DOCUMENTS

| 5,329,266 | A | * | 7/1994 | Soeldner et al. | ............. | 335/216 |
| 5,450,903 | A | | 9/1995 | Budde | | |
| 6,822,451 | B2 | * | 11/2004 | Hollis | ........................ | 324/319 |

FOREIGN PATENT DOCUMENTS

| DE | 44 08 290 A1 | 9/1995 |
| EP | 0 468 425 A2 | 1/1992 |
| GB | 2 298 282 A | 8/1996 |
| JP | 4-106907 | 4/1992 |

OTHER PUBLICATIONS

Great Britain Examination Report dated Nov. 30, 2006 (Two (2) Pages).
GB Search Report dated Jun. 10, 2005 translated in English (One (1) page).

* cited by examiner

*Primary Examiner*—Ramon M Barrera
(74) *Attorney, Agent, or Firm*—Crowell & Moring LLP

(57) ABSTRACT

A superconducting magnet system comprising a superconducting magnet, itself comprising a plurality of magnet coils, arranged to protect quench heaters yet provide effective quench protection.

4 Claims, 3 Drawing Sheets

SUPERCONDUCTING MAGNET SYSTEM

This invention concerns a protection circuit for a superconducting magnet. In particular, it relates to a protection circuit for protecting the superconducting magnet from damage which could otherwise occur during a quench. A quench occurs when a superconductor, such as used in superconducting magnets, reverts to a resistive state. This may be caused by localized heating in one part of the superconductor, either due to local movement or friction, local heating or a defect in the material of the superconductor. For any of these reasons, a small part of the superconductor ceases to be superconductive, and enters a resistive state. Any current flowing through the resistive part will cause local Joule heating. This will cause the adjacent parts of the superconductor to quench, resulting in a larger resistive part, in turn causing further Joule heating. Very rapidly, the superconductor enters a resistive state, with a potentially very large current still flowing. When this happens, a large part of the stored field energy, which may in the order of several mega joules, will be dissipated as heat. If this process is not adequately managed, this energy can be dissipated in confined areas, resulting in local temperature rises which can damage the coil areas at or near the part where the quench was initiated.

PRIOR ART

It is known to attempt to avoid harmful concentration of heat dissipation by spreading the quench process, so that the resulting heat is dissipated over as much of the available superconductor as possible. This will result in a quench involving substantially the whole of the superconductor, meaning that no part should reach a dangerous temperature. In a superconducting magnet, such as those used in MRI or NMR imaging systems, this is typically achieved by deliberately initiating a quench on the superconductor coils other than the coil where the quench started. The deliberate quench initiation is typically achieved by applying a current to heaters which are in close thermal contact to the coils. Typically, each coil will be fitted with two or more heaters.

FIG. 1 shows a circuit diagram of a known quench protection circuit, suitable for installation in superconducting magnets of MRI or NMR imaging systems. A superconducting magnet 10 is represented, comprising coils L1-L6 connected in series. Each of these coils has a corresponding heater R1-R6 in intimate thermal contact. This may be achieved by gluing the heaters on the surface of the coils. The heaters are electrically connected in series, and this series arrangement is connected in parallel with a subset L2-L5 of the superconductor coils. Current injection leads 12 are provided, one to each end 14, 16 of the series connection of superconducting coils. The ends 14, 16 of the series of superconducting coils are connected to a cryogenic switch 18.

All superconducting magnets which are operated in the so-called persistent mode have a cryogenic switch. Essentially, it is a piece of superconductor wire, in series with the magnet coils, with a heater attached to it. If the heater is on, the cryogenic switch 18 is normally conducting and is open. When the system is attached to an external power supply by leads 12, current will flow though the superconducting coils 10, with only a trickle running through the cryogenic switch 18. When the magnet system is 'ramped' to the required current, the switch heater is turned off, and the cryogenic switch 18 becomes superconducting: the cryogenic switch is closed. As the external power supply connected to leads 12 is ramped down, the current through the cryogenic switch 18 will increase by the same amount as the decrease in the current through the external power supply. Once the external power supply is ramped down completely, the current leads 12 may be removed, to limit heat leakage into the cryogenic magnet system.

The ends 14, 16 of the series of superconducting coils are connected by a diode pack 20, which is connected in parallel with cryogenic switch 18. A similar diode pack 22 is in series with the heater R1-R6. In each of these diode packs 20, 22, two series connections of typically two diodes or more are placed in inverse parallel.

Diode pack 20 protects the cryogenic switch 18. To illustrate the protection offered by the diode pack 20, consider the situation when the magnet current is being ramped. The cryogenic switch 18 is open and a current of, for example, 500 A is flowing through the coils L1-L6, the leads 12 and an associated power supply unit. If for some reason the current is interrupted, in the absence of diode pack 20, the inductance of the coils acts to force the 500 A current through the cryogenic switch 18. During ramp-up, this switch would be which in its open state, with a resistance in the region of 30Ω. This would generate a heat dissipation of up to 500 A×500 A×30Ω=7.5 MW, sufficient to destroy the cryogenic switch 18. In the presence of the diode pack 20, the diode pack 20 will become conductive as soon as the voltage across the cryogenic switch 18 exceeds a threshold voltage of the diode pack. This will occur at a relatively low voltage across the switch, before the current in the cryogenic switch 18 has risen sufficiently to cause any damage. In order to maintain the diode pack in a non-conductive state during current ramp-up of the magnet, the threshold voltage of pack 20 should be slightly higher than the ramping voltage L.dI/dt, where L is the inductance of the magnet coils, and dI/dt is the rate of increase of the current through the magnet coils. For example, the voltage across the coils may be ramped at 10 Volts per second, with the current increasing accordingly.

Diode pack 22 stops the heaters R1-R6 from conducting during current ramping of the magnet coils, as its threshold voltage is selected to be greater than ramping voltage L.dI/dt. The diode pack will become conductive allowing the heaters to function if a higher voltage develops across the magnet coils, for example during a quench.

When one of the coils L1-L6 quenches, a voltage will appear across that coil, and so also across the series connection of resistors R1-R6 and diode pack 22. This voltage rises rapidly in time, as the quench propagates within the coil. When a certain threshold voltage has been achieved, diode pack 22 will begin to conduct. A current $i_r$ starts to flow through the heaters R1-R6. These heaters will then initiate quenches locally in each coil L1-L6. By initiating quenches in all of the coils, the energy to be dissipated in the quench is spread relatively evenly across all of the coils, with the intention of avoiding any one coil heating enough to be damaged.

This arrangement has at least two drawbacks. Firstly, the voltage generated by the quench can achieve high values, causing high currents and dissipation in the heaters, which can result in the destruction of said heaters. The alternative to this would be to provide larger heaters, which in turn would introduce a time delay in heating. Large heaters have a relatively large thermal inertia, and take a relatively long time to heat up. Ideally, the heaters are required to heat instantaneously as soon as a quench has occurred anywhere in the magnet. Secondly, the threshold voltage for operation of the heaters is determined by the forward voltage of the diode pack 22, which can be higher than desirable. This may not begin to conduct soon enough, and the risk of damage to the coils may not be fully eliminated.

The present invention accordingly provides apparatus as set out in the appended claims.

The above, and further, objects characteristics and advantages of the present invention will become more apparent by reference to the following description of certain embodiments thereof, with reference to the accompanying drawings, wherein.

According to the present invention, each coil L1-L6 is split into two or more sub-coils, called 'blocks' in the following description. The split may be arranged in the radial direction, or in the axial direction, or a combination of both. Preferably, there is the same length of superconducting wire in each block of one coil. Each of the coils is preferably split into the same number of equally sized blocks, being at least two blocks per coil.

Figure 1:
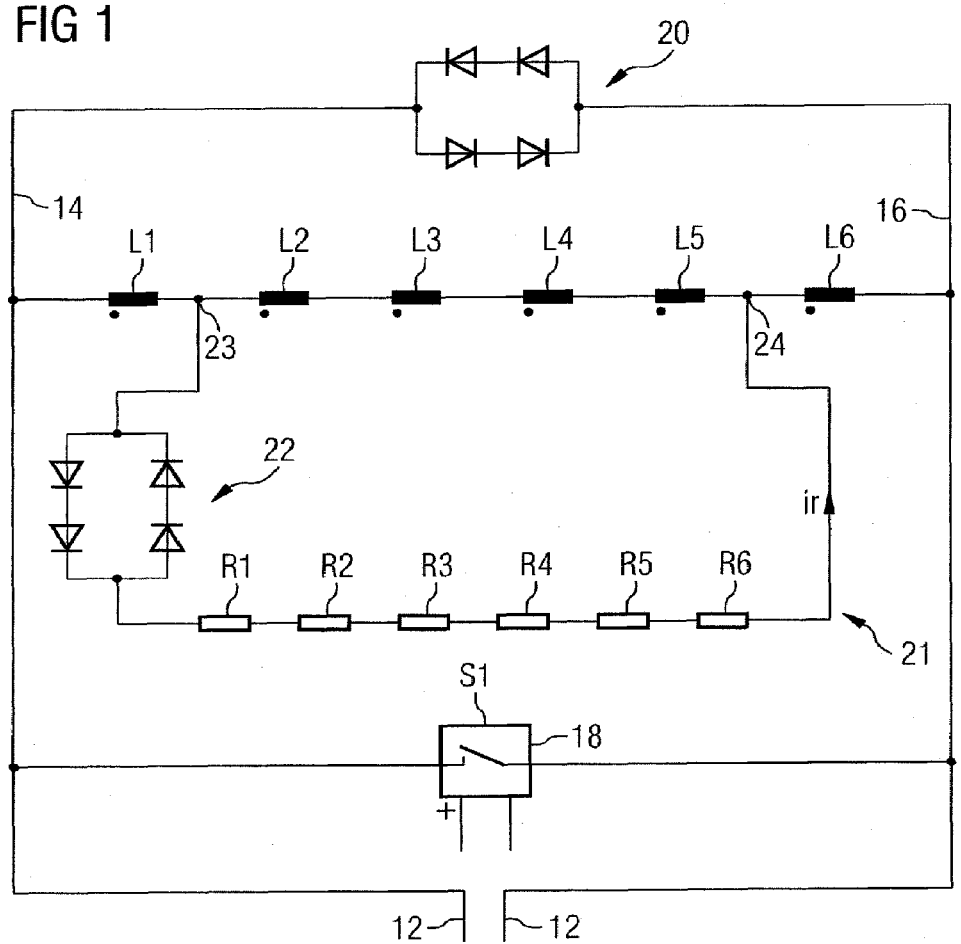
FIG. 1 shows a superconducting magnet circuit of the prior art.
Figure 2:
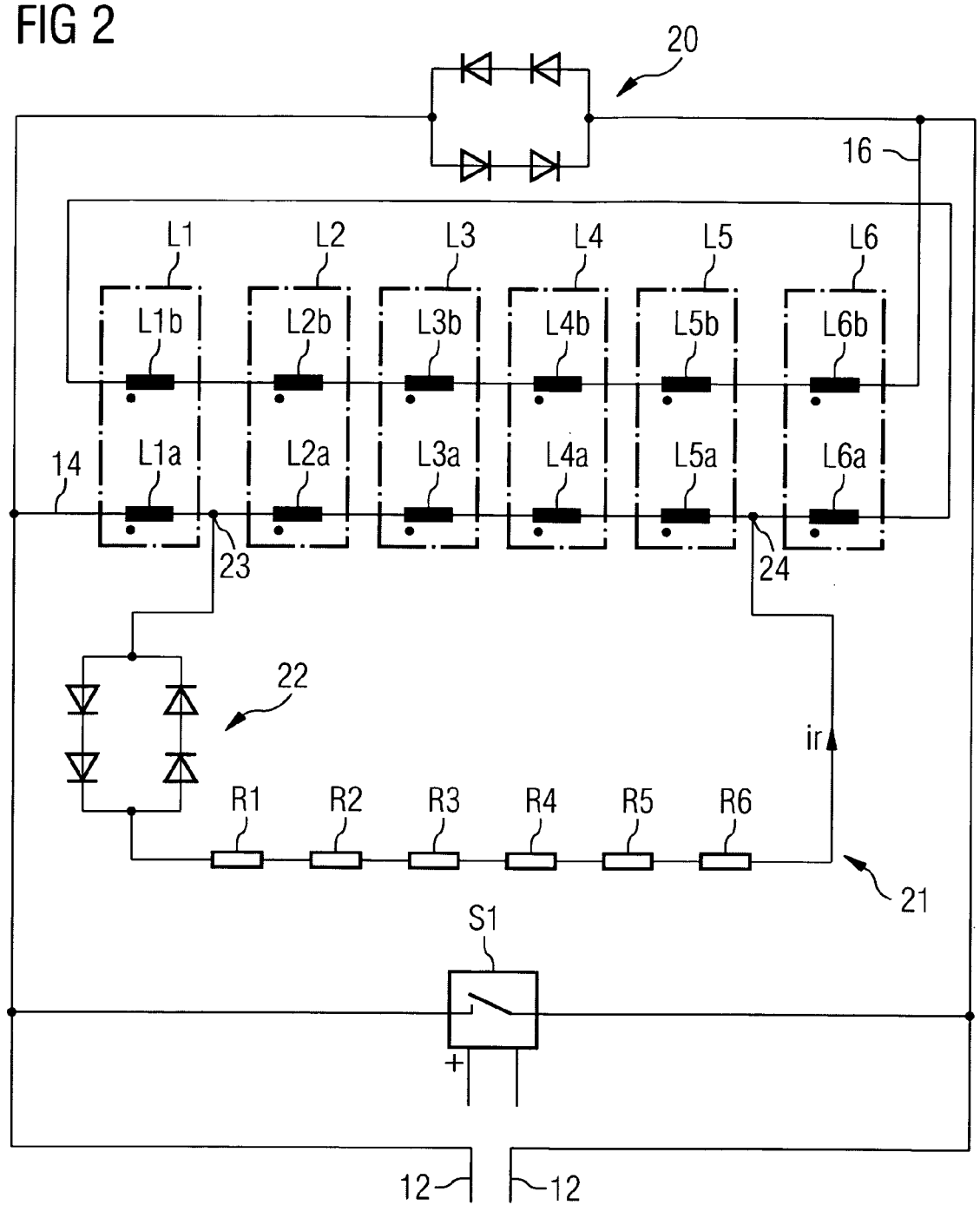
FIG. 2 shows a superconducting magnet circuit according to the present invention.

FIG. 2 shows a diagram of a circuit according to an embodiment of the present invention. Features corresponding to features shown in FIG. 1 carry corresponding reference labels. Each of the superconducting coils L1 to L6 are split into two electrically separate coil blocks. These are denoted L1$a$ and L1$b$ to L6$a$ and L6$b$ respectively. Superconducting coils L1$a$ to L6$a$ and L1$b$ to L6$b$ generate a magnetic field in a manner similar to the coils L1-L6 in FIG. 1.

Heaters R1-R6 are resistive heaters, which are in close thermal contact with the superconducting coils, L1$a$-L6$a$ and L1$b$-L6$b$. As discussed with reference to the arrangement of FIG. 1, this can be achieved by gluing the heaters on the surface of the coils.

In one embodiment of the invention, the blocks (e.g. L1$a$ and L1$b$) of each coil (e.g. L1) are electrically separate but physically contiguous.

Figure 3A:
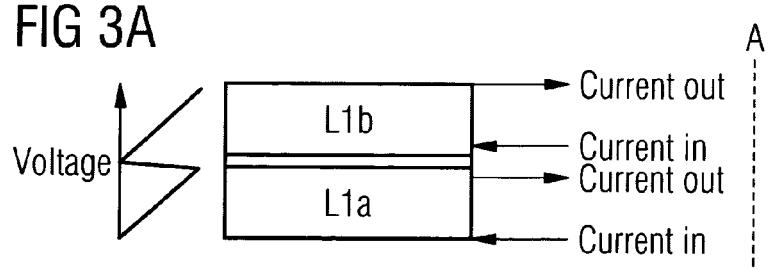
FIGS. 3A-3B show coil division according to embodiments of the present invention.

FIG. 3A shows a half cross-section of a coil according to the invention arranged about axis A. In the embodiment of FIG. 3A, the coil comprises conventionally wound coil blocks. The coil blocks L1$a$, L1$b$ are wound in the same rotational sense and have electrical isolation at their mutual interface. Current flows in the same direction in each block, and therefore flows in the same direction about axis A, to generate a magnetic field as would be generated by a similar magnet which is not divided into blocks. The high voltage end of one block is placed adjacent to the low voltage end of the other block.

Figure 3B:
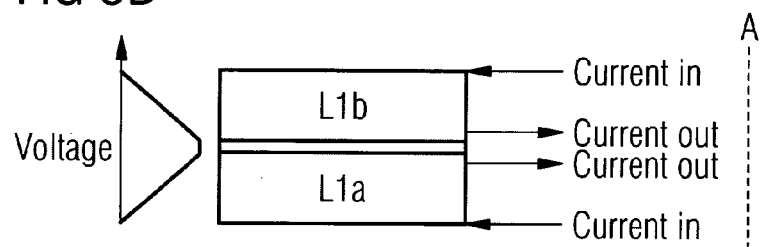

FIG. 3B shows a similar half cross-section view of a coil according to another embodiment of the invention, also arranged about axis A. The coil comprises counter-wound blocks L1$a$, L1$b$. The successive coil blocks, here shown adjacent in an axial direction, are wound in alternate rotational sense. The high voltage ends of the blocks are placed next to each other.

The current in each coil block is arranged so that the overall current direction is continuous, that is, the current in each block is arranged so that it flows in the same direction about axis A, despite the fact that the coil blocks are wound in opposite directions. A magnetic field is generated as would be generated by a similar magnet which is not divided into blocks. The high voltage end of one block is placed adjacent to the high-voltage end of another block.

In further embodiments of the invention, the coil may be divided into three or more blocks. It may be divided axially, radially, or a combination of both.

In the embodiment illustrated in FIG. 2, first blocks L1$a$-L6$a$ of the coils are connected in series in a first partial magnet circuit. Second blocks L1$b$-L6$b$ of the coils are connected in series, in a second partial magnet circuit. These two partial magnet circuits are then themselves connected in series. This total arrangement of coil blocks is connected into the rest of the circuit as in the prior art shown in FIG. 1.

The operation of the embodiment of FIG. 2 will now be described. If one of the coil blocks L1$a$-L6$a$, L1$b$-L6$b$ quenches, energy will be dissipated, resulting in a reduction of current and magnetic flux in that coil block as it reverts from its superconducting state to a normal state. There will be a resistive voltage generated in the quenching coil block. In opposition to this resistive voltage, an opposite inductive voltage will be generated in all the other coil blocks.

The quenching coil block will heat rapidly as a result of the current flowing through the resistive, quenched, part of the coil. Other coil blocks which are physically contiguous with the quenching coil block will be heated by the quenching coil block, and so will rapidly revert to a normal, non-superconducting state. To a first approximation all the physically contiguous coil blocks (e.g. L1$a$, L1$b$) of the quenching coil (L1) will transit to a resistive state coincidentally.

Since the coil L1 is split into a number of smaller coil blocks L1$a$, L1$b$, the voltage generated across each coil block will be lower than the voltage that would be generated across a coil having all coil blocks electrically connected adjacently in a series circuit, such as shown in FIG. 1. The reduction in voltage corresponds to a factor of the number of blocks into which the coil has been divided. As an example, if coil block L1$a$ quenches, then the resistive voltage generated in it will be matched by an opposing inductive voltage generated in coil blocks L2$a$ to L6$a$. Thermal quench propagation through coil L1 will mean that coil block L1$b$ will also quench and generate a resistive voltage, since it will quench at a time very close to the quench of coil L1$a$. The resistive voltage across coil block L1$b$ will be matched by an opposing inductive voltage across coils L2$b$ to L6$b$. Therefore there will be an essentially zero total voltage across the partial magnet circuit L1$a$ to L6$a$ and also across the partial magnet circuit L1$b$ to L6$b$. The maximum voltage generated during a quench in any coil block will be lower than if the coil was electrically contiguous. This will correspondingly result in a much reduced risk of damage to the magnet.

A quench propagation circuit can also be incorporated into the magnet circuit in a conventional manner. For example, the embodiment of FIG. 2 includes a quench propagation circuit 21 comprising heaters R1-R6 and diode pack 22. This quench propagation circuit is identical to that shown in FIG. 1 with the exception that it is connected 23, 24 across a subset (L2$a$-L5$a$) of the first partial magnet circuit of first coil blocks (L1$a$-L6$a$) of each of the coils (L1-L6). The propagation circuit 21 will begin to conduct in response to a voltage generated across the connections 23, 24 by the first partial magnet circuit.

The voltage across the connections 23, 24 of the quench propagation circuit 21 will be lower than the voltage across the corresponding connections in the prior art arrangement of FIG. 1. Supposing coil L2 in FIG. 1 were to quench first, the whole voltage resulting from the current I flowing in the resistive coil L2 will appear across the connections 23, 24 and so across the quench protection circuit 21. According to the invention, and referring to the embodiment shown in FIG. 2, supposing that coil blocks L2$a$ and L2$b$, making up coil L2, were to quench first, only one half of the whole voltage resulting from the current I flowing in the resistive coil L2 will appear across coil block L2a and so across the connections 23, 24 and the quench protection circuit 21. This is because the other half of the whole voltage resulting from the current I flowing in the resistive coil L2 will appear across coil block L2b. The voltage across the quench propagation circuit will be correspondingly lower since only a subset of the total magnet coils L1-L6 are being used for that purpose. In each partial magnet circuit, an inductive voltage is induced in the remaining coil blocks to balance the voltage appearing across the quenched coil block.

Since, according to an advantage of the present invention, a reduced voltage is applied to the quench propagation circuit 21 during a quench, the quench propagation circuit can be designed with small, low resistance resistors and so may react more rapidly than the quench protection circuits of the prior art. This in turn increases the effectiveness of the quench propagation circuit in protecting the magnet from damage in the case of a quench, since the reduced voltage available to drive the quench propagation circuit allows low resistance heaters to be used to propagate the quench more rapidly.

As mentioned with respect to FIG. 1, diode pack 22 prevents the activation of the quench propagation circuit 21 during current ramp-up of the magnet.

The division of each magnet coil (L1-L6) into a number of coil blocks (L1a-L6a, L1b-L6b) means that a lower voltage is generated in each coil block during a quench than over the whole coil in a conventional arrangement. This reduces the likelihood of damage to the coils caused by over-voltage, and also reduces the chance of the coils being damaged by overheating, since the quench propagation circuit of the present invention is faster acting than known arrangements. As a result, the maximum voltage generated in any coil block (e.g. L2a) during a quench is lower than the maximum voltage generated over a whole coil (e.g. L2) during a quench in a conventional arrangement, by a factor of the number of coil blocks in the coil.

The division of the magnet into two distinct, but consecutive, partial magnet circuits means that the voltage generated across each partial magnet circuit is essentially zero during a quench, since the resistive voltage across the quenching coil block is matched by opposing inductive voltages developed across the remaining coil blocks in that partial magnet circuit.

Figure 4:
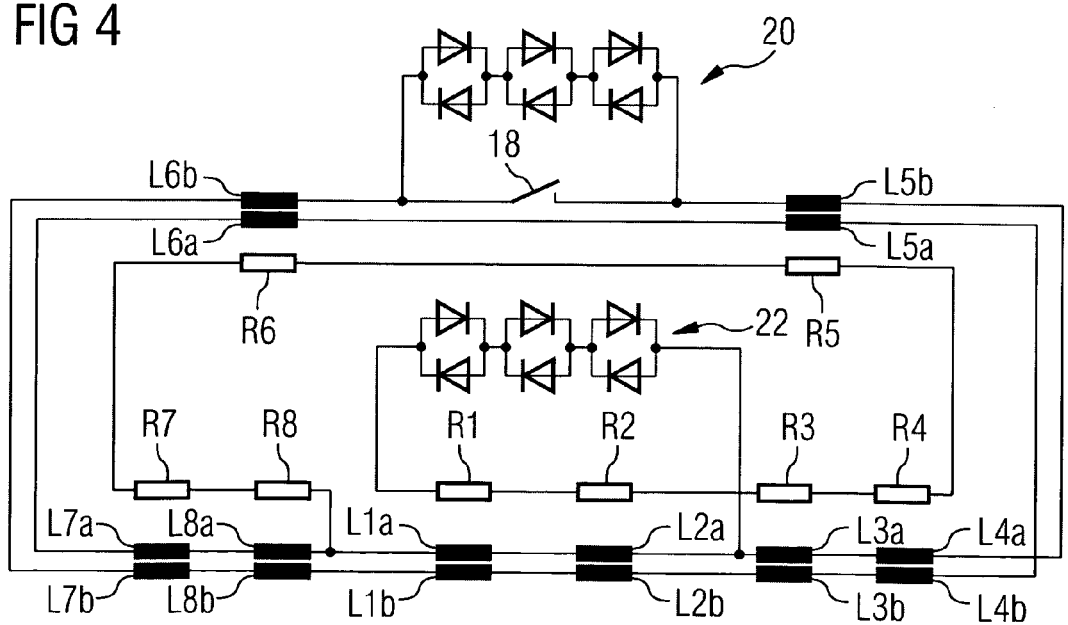
FIG. 4 shows a superconducting magnet circuit according to another embodiment of the present invention.

Thus, according to the present invention, and as illustrated in FIGS. 2 and 4, superconducting magnetic coils are split, axially or radially or both, into a plurality of sub-coils (blocks). The blocks of each coil are placed physically contiguously, but are electrically connected non-adjacently in a series circuit.

Corresponding blocks from each coil may be connected in series as separate partial magnetic circuits, which are themselves connected in series to provide a complete magnetic circuit. Such arrangement serves to generate a magnetic field such as would be generated in the absence of such coil division.

FIG. 4 shows another embodiment of the present invention, arranged to correspond with the physical placement of magnetic coils in a typical superconducting magnet system, shown as a partial cross-section of coils arranged about axis A. Features corresponding to features shown in other drawings carry corresponding reference numerals.

While the present invention has been described by reference to a limited number of embodiments, various modifications and variations may be made, within the scope of the appended claims. For example, each coil may be divided radially, axially, or a combination of the two. The blocks may be connected in corresponding partial circuits as described, or in other series arrangements.

The invention claimed is:

1. A superconducting magnet system comprising a superconducting magnet having a plurality of magnet coils each of which is electrically divided into a number of sub-coils; wherein:
   said sub-coils of each coil are physically contiguous, but electrically connected non-adjacently in a series circuit;
   corresponding sub-coils of the magnet coils are connected in series in separate partial magnet circuits, said partial magnet circuits being themselves connected in series to form the series circuit; and
   one of the physically contiguous sub-coils of a single magnet coil is wound in an opposite rotational sense to another of the physically contiguous sub-coils of that magnet coil.

2. A superconducting magnet system according to claim 1, further comprising a quench propagation circuit (21) comprising a series connection of a number of resistive heaters attached to respective coils of the magnet, the series connection being connected in parallel with a subset of the sub-coils of one of the partial magnetic circuits.

3. A superconducting magnet system as in claim 1, wherein the physically contiguous sub-coils of a single magnet coil are separated by electrical insulation.

4. An MRI or NMR imaging system comprising a superconducting magnet system according to claim 1.

* * * * *